(12) United States Patent
Murai et al.

(10) Patent No.: US 8,394,284 B2
(45) Date of Patent: Mar. 12, 2013

(54) THERMOELECTRIC CONVERTER AND METHOD OF MANUFACTURING SAME

(75) Inventors: Junya Murai, Susono (JP); Takuji Kita, Numazu (JP)

(73) Assignee: Toyota Jidosha Kabushiki Kaisha, Toyota-Shi, Aichi-Ken (JP)

( * ) Notice: Subject to any disclaimer, the term of this patent is extended or adjusted under 35 U.S.C. 154(b) by 624 days.

(21) Appl. No.: 12/663,019

(22) PCT Filed: May 28, 2008

(86) PCT No.: PCT/JP2008/060244
§ 371 (c)(1),
(2), (4) Date: Dec. 4, 2009

(87) PCT Pub. No.: WO2008/149871
PCT Pub. Date: Dec. 11, 2008

(65) Prior Publication Data
US 2010/0212328 A1     Aug. 26, 2010

(30) Foreign Application Priority Data
Jun. 6, 2007   (JP) .................................. 2007-150729

(51) Int. Cl.
| H01L 35/26 | (2006.01) |
| H01L 35/34 | (2006.01) |
| H01L 35/18 | (2006.01) |
| C22C 12/00 | (2006.01) |
| B22F 1/02 | (2006.01) |
| B22F 9/24 | (2006.01) |

(52) U.S. Cl. ................. 252/62.3 T; 136/236.1; 136/201; 136/200

(58) Field of Classification Search ............... 252/62.3 T; 136/236.1, 201, 200
See application file for complete search history.

(56) References Cited

U.S. PATENT DOCUMENTS

| 4,992,235 A | 2/1991 | Tokai et al. |
| 2005/0268956 A1* | 12/2005 | Take ............................ 136/208 |
| 2005/0284512 A1* | 12/2005 | Heremans et al. ......... 136/236.1 |
| 2010/0212328 A1 | 8/2010 | Murai et al. |

FOREIGN PATENT DOCUMENTS

| CN | 1569648 A | 1/2005 |
| EP | 1 959 508 A1 | 8/2008 |
| EP | 2 154 734 A1 | 2/2010 |
| EP | 2 154 735 A1 | 2/2010 |
| EP | 2 154 736 A1 | 2/2010 |
| JP | 06-163996 | 6/1994 |
| JP | 06-204571 | 7/1994 |
| JP | 09-074229 | 3/1997 |

(Continued)

OTHER PUBLICATIONS

Translation of JP 2007-021670.*
International Search Report in International Application No. PCT/IB2010/001533; Mailing Date: Apr. 11, 2011.

(Continued)

*Primary Examiner* — Carol M Koslow
(74) *Attorney, Agent, or Firm* — Finnegan, Henderson, Farabow, Garrett & Dunner, L.L.P.

(57) ABSTRACT

A thermoelectric converter made of a thermoelectric conversion material is provided in which metal or alloy particles having an average particle size of 1 to 100 nm are dispersed, wherein at least a part of the metal or alloy particles are dispersed at a distance not more than the mean free path of the phonon of the thermoelectric conversion material.

2 Claims, 4 Drawing Sheets

FOREIGN PATENT DOCUMENTS

| | | |
|---|---|---|
| JP | 10-060563 | 3/1998 |
| JP | 10-242535 | 9/1998 |
| JP | 11-097750 | 4/1999 |
| JP | 11-317548 | 11/1999 |
| JP | 2000-164940 | 6/2000 |
| JP | 2000-261047 | 9/2000 |
| JP | 2000-261048 | 9/2000 |
| JP | 2001-185767 | 7/2001 |
| JP | 2003-73705 | 3/2003 |
| JP | 2003-225743 | 8/2003 |
| JP | 2004-363576 | 12/2004 |
| JP | 2005-294478 | 10/2005 |
| JP | 2005-325419 | 11/2005 |
| JP | 2005-343782 | 12/2005 |
| JP | 2006-237461 | 9/2006 |
| JP | 2007-21670 | 2/2007 |
| JP | 2007-021670 * | 2/2007 |
| JP | 2008-305907 | 12/2008 |
| JP | 2008-305919 | 12/2008 |
| WO | WO 2008/041951 A1 | 4/2008 |
| WO | WO 2008/150026 A1 | 12/2008 |

OTHER PUBLICATIONS

Written Opinion of the International Searching Authority in International Application No. PCT/IB2010/001533; Mailing Date: Apr. 11, 2011.

Applicant's Response to Written Opinion of the International Searching Authority in International Application No. PCT/IB2010/001533 (Jul. 1, 2011).

J. Murai et al., U.S. Appl. No. 13/377,876, filed Dec. 13, 2011.

International Search Report in International Application No. PCT/JP2008/060244; Mailing Date: Sep. 2, 2008.

Extended European Search Report for EP Appl. No. 08765503.1 dated Apr. 5, 2012.

U.S. Appl. No. 12/602,820; Office Actions dated Mar. 9, 2012; May 4, 2012; Aug. 15, 2012; Reply to Office Action filed Aug. 3, 2012.

Kim et al., "Thermal Conductivity Reduction and Thermoelectric Figure of Merit Increase by Embedding Nanoparticles in Crystalline Semiconductors," Physical Review Letters, Colum 96 Issue 4, Feb. 2, 2006, pp. 045901-1-045901-4.

* cited by examiner

THERMOELECTRIC CONVERTER AND METHOD OF MANUFACTURING SAME

CROSS-REFERENCE TO RELATED APPLICATIONS

This application is a national phase application of International Application No. PCT/JP2008/060244, filed May 28, 2008, and claims the priority of Japanese Application No. 2007-150729, filed Jun. 6, 2007, the contents of both of which are incorporated herein by reference.

FIELD OF THE INVENTION

The present invention relates to a thermoelectric converter comprising metal or alloy particles, and a method of manufacturing the same.

BACKGROUND ART

A thermoelectric conversion material is a material which can interconvert thermal and electric energies, and constitutes a thermoelectric converter which is used as a thermoelectric cooling element or a thermoelectric power generating element. Thermoelectric conversion material is used for thermoelectric conversion using the Seebeck effect. Thermoelectric converting performance is represented by Formula (1) which is called the performance index ZT.

$$ZT = \alpha^2 \sigma T / \kappa \quad (1)$$

(wherein, $\alpha$ represents Seebeck coefficient, $\sigma$ represents the electrical conductivity, $\kappa$ represents the thermal conductivity, and T represents the measured temperature.)

It is apparent, according to Formula (1), that in order to improve the thermoelectric converting performances of a thermoelectric conversion material, Seebeck coefficient $\alpha$ and electrical conductivity $\sigma$ of the material are increased, and thermal conductivity $\kappa$ of the material is decreased. Japanese Unexamined Patent Publication 10-242535 describes adding fine particles (inactive fine particles) which do not react with a base material of a thermoelectric conversion material to particles of a starting material of the thermoelectric conversion material in order to decrease thermal conductivity $\kappa$ of the material. Thereby, the Inactive fine particles can scatter phonons, which are the major factor of the thermal conduction in a thermoelectric conversion material, to decrease thermal conductivity $\kappa$.

However, in a conventional conversion material in which the inactive fine particles are unevenly distributed, the inactive fine particles, which provide the scattering effect of the phonons, have a large adverse influence on the other physical properties, such as electrical resistivity, due to the uneven distribution thereof, thus an increase in the performance of the thermoelectric conversion materials is inhibited. In order to solve this problem, Japan Unexamined Patent Publication 2000-261047 discloses a thermoelectric conversion material comprising metal or alloy particles having a submicron particle size to hundreds of microns order dispersed in the particles of the thermoelectric conversion material.

According to the disclosure of above Japan Unexamined Patent Publication 2000-261047, electrical conductivity is improved by compounding a metal as a dispersant, and thermal conductivity is also reduced because a thermal barrier is formed at a border between the metal powders and the matrix of the thermoelectric conversion material.

However, the metals or alloys as the dispersant have a particle size of submicron to a few hundreds micron order and therefore, it is impossible to disperse the metals or alloys into the thermoelectric conversion material in the nanomicron order. Further, grain-growth of the metals or alloys may occur during sintering, as a result, the distance between the metals is larger than the mean free path of the phonons of the thermoelectric conversion material, and consequently thermal conductivity cannot be sufficiently reduced.

Since the carrier (an electron or electron hole) can carry both heat and electricity, electrical conductivity $\sigma$ and thermal conductivity $\kappa$ are proportional. Additionally, it is known that electrical conductivity $\sigma$ and Seebeck coefficient $\alpha$ are inversely proportional. Therefore, if electrical conductivity $\sigma$ is increased, thermal conductivity $\kappa$ is increased and Seebeck coefficient $\alpha$ is decreased accordingly. Furthermore, as the effective mass and mobility are inversely proportional, the effective mass is decreased when the mobility is increased.

Therefore, the object of the present invention is to eliminate the drawbacks of the prior art stated above by providing a method for manufacturing a thermoelectric converter having a good performance index.

DISCLOSURE OF THE INVENTION

To achieve the above object, according to a first aspect of the present invention, there is provided a thermoelectric converter made of a thermoelectric conversion material in which metal or alloy particles having an average particle size of 1 to 100 nm are dispersed, wherein at least part of the metal or alloy particles are dispersed at a distance not more than the mean free path of the phonons of the thermoelectric conversion material.

To achieve the above object, according to a second aspect in the first aspect, at least part of the metal or alloy particles are dispersed at a distance not less than the mean free path of carriers of the thermoelectric conversion material.

To achieve the above object, according to a third aspect of the invention, there is provided a method of manufacturing a thermoelectric conversion material, comprising the steps of: dropping a solution, which contains a salt of an element constituting the thermoelectric conversion material and a larger amount of a salt of a metal or alloy than the amount of the salt which is solid-dissolved in the thermoelectric conversion material and forms an alloy, into a solution containing a pH controlling agent and a reducing agent; depositing particles of the element constituting the thermoelectric conversion material and the metal or alloy; depositing a dispersion phase of the metal or alloy in a continuous phase of the thermoelectric conversion material by heat treatment; and sintering the same.

To achieve the above object, according to a fourth aspect, the method of manufacturing the thermoelectric conversion material of the first aspect comprises the steps of: dropping a solution containing a salt of an element constituting the thermoelectric conversion material, into a solution containing metal or alloy particles having a higher melting point than that of the thermoelectric conversion material and an average particle size of 1 to 100 nm, a pH controlling agent and a reducing agent; reduction-depositing particles of the raw material of the thermoelectric conversion material on the metal or alloy particles; heating the particles of the raw material to form composite particles in which the thermoelectric conversion material is coated on the metal or alloy particle; and filling and sintering the composite particles.

According to the first aspect, the dispersion distance of at least part of the metal or alloy particles are not more than the mean free path of the phonons of the thermoelectric conversion material, so that the scattering of the phonons is enhanced at the borders of the metal or alloy particles, and accordingly the lattice thermal conductivity is remarkably decreased and the performance of thermoelectric converter is improved.

A carrier (an electron or an electron hole) contained in the thermoelectric conversion material can carry heat and electricity together, electrical conductivity σ and thermal conductivity κ have a proportional relationship. However, if the dispersion distance of the metal particles dispersed in the thermoelectric conversion material is larger than the mean free path of the carriers of the thermoelectric conversion material, the decreased rate thermal conductivity κ is larger than that of the electrical conductivity, and as a result performance index ZT is increased. Also, generally, electrical conductivity σ and Seebeck coefficient α have an inverse relationship, and accordingly when the electrical conductivity is decreased, Seebeck coefficient α is increased. Namely, according to the second invention, on the right side of Formula (1), as the decrease rate of thermal conductivity κ in the denominator is larger than that of electrical conductivity σ in the numerator, and α in the denominator is also increased, performance index ZT is also increased.

According to the third aspect, particles of the element constituting the thermoelectric conversion material and having a nano order particle size and the metal or alloy particles are produced, the composite particles are prepared therefrom and are subject to heat treatment, so that a base phase and a separate phase are formed by the phase separation of a phase of the thermoelectric conversion material and a phase of the metal. The base phase and the separate phase are separated under heat treatment, thus the phases are highly thermally stable. Thus, the stable thermoelectric converter can be provided without causing grain-growth of the metal by sintering.

According to the fourth aspect, the metal particles are not dispersed in the thermoelectric conversion material, but the thermoelectric conversion material is deposited on the metal particles having a nano order particle size to coat the metal particles therewith, thus the composite particles, of which the core portion is made of the metal particles and the shell portion is made of the thermoelectric conversion material, are formed. When the composite particles are filled and sintered, the shell portions of the adjacent composite particles (the coating layer made of the thermoelectric conversion material) are bound to each other. Therefore, the dispersion distance of the metal particles can be controlled by the thickness of the shell portion, and consequently, the metal particles tend to not be bound, and the uneven distribution of the metal particles can be inhibited.

BRIEF DESCRIPTION OF THE DRAWINGS

FIG. 3(a) represents the aggregate of the raw particles, FIG. 3(b) represents the metal phase in the continuous phase of the thermoelectric converter, and FIG. 3(c) represents the sintered body.

FIG. 4(a) represents raw particles, FIG. 4(b) represents the aggregate of the raw particles, and FIG. 4(c) represents the sintered body.

DESCRIPTION OF THE PREFERRED EMBODIMENTS

Figure 1:
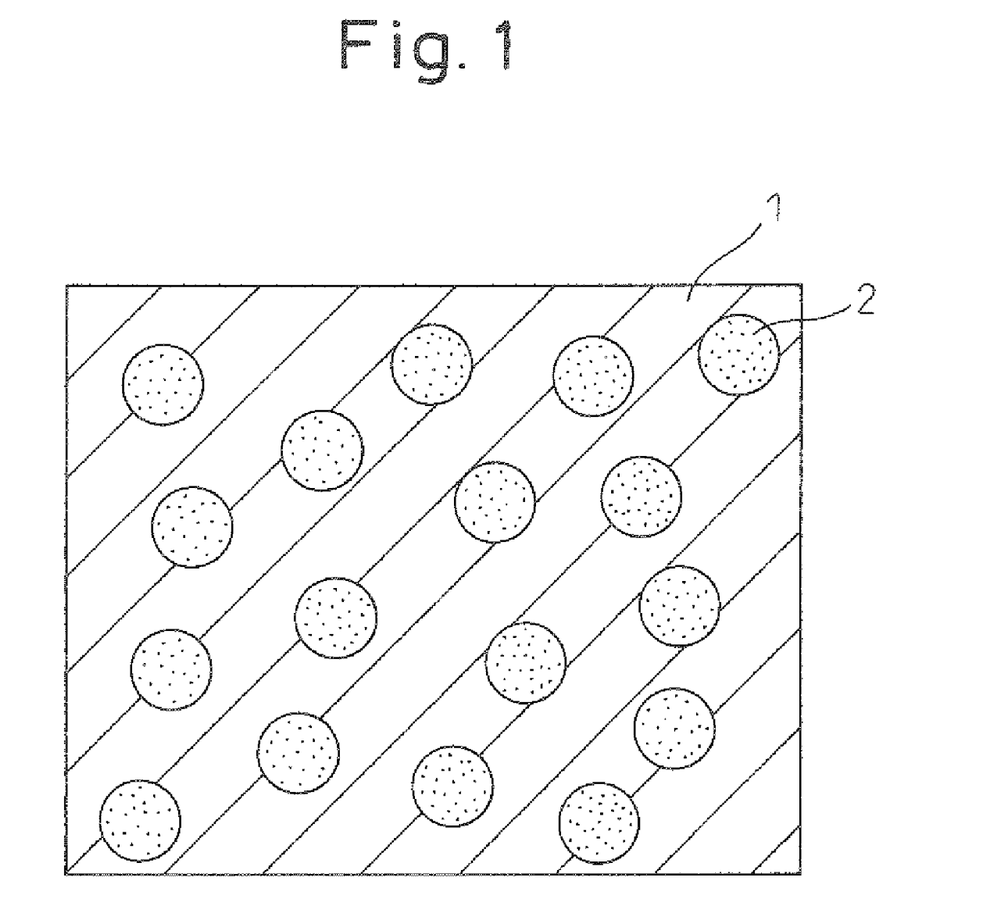
FIG. 1 is a schematic diagram representing the constitution of the present invention.

As is shown in FIG. 1, a thermoelectric converter of the present invention is characterized in that metal or alloy particles 2 having an average particle size of 1 to 100 nm are dispersed in a thermoelectric conversion material 1, wherein at least a part of the metal or alloy particles are dispersed at a distance of not more than the mean free path of the phonons of the thermoelectric conversion material.

Figure 2:
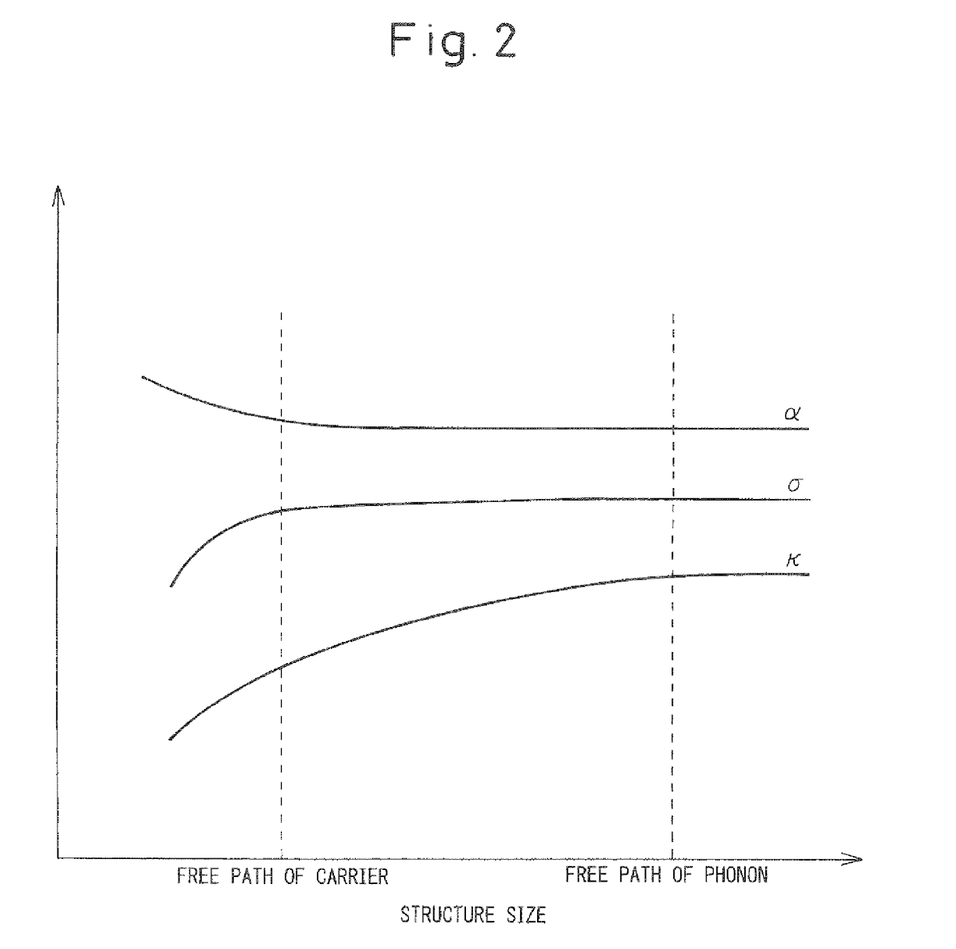
FIG. 2 is a graph representing the relationship of the structure size of the thermoelectric conversion material to Seebeck coefficient α, electrical conductivity σ, or thermal conductivity κ.

The relationship between the performance index ZT and the structure constitution of the thermoelectric conversion material is explained in detail referring to FIG. 2. As shown in FIG. 2, thermal conductivity κ of the thermoelectric conversion material is gradually decreased as the structure size of the thermoelectric conversion material becomes smaller than the length of the mean free path of the phonons. Therefore, performance index ZT is improved when the structure size is designed to be less than the mean free path of phonons.

On the other hand, if the structure size of the thermoelectric conversion material becomes smaller than the mean free path of the phonons, electrical conductivity σ does not decrease, but when the structure size becomes a particle size approximately equal to the length of the mean free path of the carriers or less, electrical conductivity σ decreases. Based on the fact that the structure size of the thermoelectric conversion material at which thermal conductivity κ begins decreasing is different from the structure size of the thermoelectric conversion material at which electrical conductivity σ begins decreasing, performance index ET represented by Formula (1) above can be further increased by selecting the structure size of the thermoelectric conversion material to be larger than the mean free path of carriers and smaller than the mean free path of phonons, so that the decreasing rate of thermal conductivity κ is higher than the decreasing rate of the electrical conductivity.

What determines the structure size of the thermoelectric conversion material is the particle size of the metal or alloy particles dispersed in the thermoelectric conversion material, or the dispersion distance between the metal or alloy particles. Therefore, in the present invention, the dispersion distance between the meta or alloy particles is controlled so as to obtain the effect mentioned above.

That is, in the present invention, the distance between the metal or alloy particles dispersed in the thermoelectric conversion material is less than or equal to the length of the mean free path of the phonons of the thermoelectric conversion material, preferably, more than the mean free path of the carriers but less than the mean free path of the phonons. Specifically, the distance is preferably in the range of 1 to 1.00 nm, more preferably 10 to 100 nm.

The mean free path (MFP) is calculated by the formula below.

Carrier MFP=(mobility×effective mass×carrier velocity)/elementary electric charge Phonon MFP=3×lattice thermal conductivity/specific heat/acoustic velocity In the formulae above, each value is obtained from the reference values and the approximation formula for the thermal properties, except that the measured value is used only for the specific heat.

The results of the carrier MFP and the carrier phonon MFP calculated for $Co_{0.94}Ni_{0.06}Sb_3$, $CoSb_3$, and $Co_{0.9}Ni_{0.1}Sb_3$ are shown below.

TABLE 1

Calculation result of carrier MFP and phonon MFP (mean free path)

| Material | Temperature | Carrier MFP (nm) | Phonon MFP (nm) |
|---|---|---|---|
| $Co_{0.94}Ni_{0.06}Sb_3$ | 300 K | 4.8 | 33 |
| | 673 K | 5.1 | 15 |
| $CoSb_3$ | 300 K | 0.8 | 85 |
| | 673 K | 1 | 42 |
| $Co_{0.9}Ni_{0.1}Sb_3$ | 300 K | 5.0 | 32 |
| | 673 K | 5.8 | 14 |

As can be seen above, the carrier MFP and the phonon MFP are determined by the material and the temperature. In the present invention, it is necessary that the disperse distance of at least a part of metal or alloy is smaller than the mean free path of the phonons at the maximum output level of the power factor ($\alpha^2\sigma$) of the thermoelectric conversion material of base phase. As the $CoSb_3$ type material exhibits the maximum output of the power factor ($\alpha^2\sigma$) at 400° C. (673K), it is necessary that the size be smaller than the mean free path of the phonons at 400° C.

When the dispersion distance is not more than the mean free path of the phonons of the thermoelectric conversion material, and is preferably 100 nm or less, the phonons are sufficiently scattered so that thermal conductivity κ of the thermoelectric conversion material is decreased. Also, in order to decrease the dispersion frequency of the carriers, it is preferable that the distance be 1 nm or more. Moreover, in order to increase the decrease rate of thermal conductivity κ than that of electrical conductivity σ, to thereby enhance the performance index ZT by making the dispersion distance not smaller than the mean free path of the carriers of the thermoelectric conversion material, it is more preferable that the distance be 10 nm or more.

Also, as mentioned above, the particle size of the metal or alloy particles dispersed in the thermoelectric conversion material is not larger than the mean free path of the phonons of the metal or alloy particles, and specifically, is 1 to 100 nm. When the particle size of the metal or alloy is not larger than the mean free path of the phonons, the phonons are sufficiently scattered by the presence of the metal or alloy particles and thermal conductivity κ is decreased, so that performance index ZT is improved.

In the present invention, the amount of the metal or alloy particles having the above particle size is 50% or more, preferably 70% or more, more preferably 95% or more based on all metal or alloy particles in the thermoelectric conversion material in terms of volume. When it is lower than 50%, the phonons are not sufficiently scattered and thermal conductivity κ may not be decreased.

In the present invention, the thermoelectric conversion material may be of a P-type or N-type. The material for P-type thermoelectric conversion material is not specifically limited. For example, $Bi_2Te_3$ type material, PbTe type material, $Zn_4Sb_3$ type material, $CoSb_3$ type material, half-Heusler type material, full-Heusler type material, and SiGe type material etc. may be used. Likewise, the material for N-type thermoelectric conversion material is not specifically limited, and known material, such as $Bi_2Te_3$ type material, PbTe type material, $Zn_4Sb_3$ type material, $CoSb_3$ type material, half-Heusler type material, full-Heusler type material, SiGe type material, $Mg_2Si$ type material, $Mg_2Sn$ type material, and CoSi type material may be used.

The thermoelectric conversion material used in the present invention preferably has an output factor of more than 1 $mW/K^2$, more preferably 2 $mW/K^2$ or more, and yet preferably 3 $mW/K^2$. When the output factor is 1 $mW/K^2$ or less, a large improvement in the performance cannot be expected. Also, thermal conductivity κ of the thermoelectric conversion material is preferably more than 5 W/mK, more preferably w/mK or more, yet preferably 10 W/mK or more. When thermal conductivity κ is more than 5 W/mK, particularly the effect of the invention is remarkable. Briefly, regarding the effect of the case that the structure size of the thermoelectric conversion material is controlled by the nano order defined in the present invention, thermal conductivity κ tends to remarkably decrease as the thermoelectric conversion material having a larger thermal conductivity κ is used, in particular, when the thermoelectric conversion material having thermal conductivity κ of more than 5 W/mK is used, a remarkable decrease effect of thermal conductivity κ appears.

As a metal material, any material which is hard to diffusion react into the thermoelectric conversion material may be used. In the present invention, by dispersing the metal or alloy particles into the thermoelectric conversion material, the electrical conductivity becomes high, moreover, at a border of the metal particles and the matrix of the thermoelectric conversion material, a thermal barrier is formed, so that the thermal conductivity can be decreased.

Next, a method of manufacturing of a thermoelectric converter of the present invention is briefly explained. The method of manufacturing the thermoelectric converter of the present invention comprises steps of: dropping a solution, which comprises a salt of an element constituting the thermoelectric conversion material, and more amount of a salt of metal or alloy than that of salt which forms an alloy by being solid-dissolved in the thermoelectric conversion material, into a solution comprising a pH controlling agent and a reducing agent; depositing particles of the element constituting the thermoelectric conversion material and the metal or alloy; depositing a dispersion phase of the metal or alloy in a continuous phase of thermoelectric conversion material by heat treatment; and sintering.

First, the solution comprising the salt of the element constituting the thermoelectric conversion material and the salt of the metal or alloy is prepared. The salt of the element constituting the thermoelectric conversion material means, for example, a hydrate of cobalt chloride, or antimony chloride when the thermoelectric conversion material is $CoSb_3$; and a hydrate of cobalt chloride, nickel chloride, and antimony chloride when the material is $Co_{0.9}Ni_{0.06}Sb_3$. Regarding a salt of an element constituting the thermoelectric conversion material, the content thereof in the solution is not specifically limited, but preferably can be controlled appropriately depending on the kind of solvent or raw material to be used. Any solvent which can resolve a salt of am element constituting the thermoelectric conversion material can be used, in particular, alcohol, water, and the like can be listed, and ethanol is preferably used.

Moreover, a salt of the metal or alloy means, for example nickel chloride when the metal to be deposited is Ni; and antimony chloride when the metal to be deposited is antimony. The amount of the salt of metal or alloy is larger than the amount of salt which is solid-dissolved in the thermoelectric conversion material and forms an alloy. For example, when the $Co_{0.9}Ni_{0.1}Sb_3$ is used as the thermoelectric conversion material, the limit of the amount of Ni to be solid-dissolved in Co is about 10%, thus, when nickel chloride of more than 10% based on Co is used, Ni is deposited in the $Co_{0.9}Ni_{0.1}Sb_3$ of the thermoelectric conversion material.

Separate from this solution of the solid constituting the thermoelectric conversion material etc., a solution comprising a pH controlling agent and a reducing agent is prepared. Any solvent which can resolve the pH controlling agent and the reducing agent can be used, in particular, alcohol, water, and the like are listed, and ethanol is preferably used. The pH controlling agent is used in order to prevent an aggregation of the metal particles and the like produced thereafter in the solution, and a known agent such as nitric acid, ammonia water, and sodium borohydride ($NaBH_4$) can be used. Further, any reducing agent which can reduce an ion of the element constituting the thermoelectric conversion material is preferred, in particular, for example, $NaBH_4$, hydrazine and so on can be used. The pH of the solution may preferably be adjusted to 3 to 6 or 8 to 11, and more preferably from 4 to 6 or 8 to 10.

Figure 3:
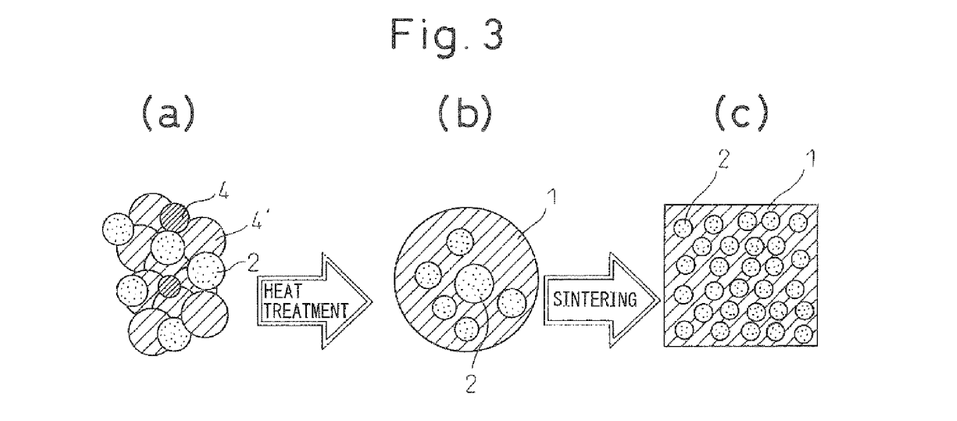
FIG. 3 is a FIG. representing the manufacture steps of the thermoelectric converter of the present invention.

Then, the solution comprising the salt of element constituting the thermoelectric conversion material and the salt of metal or alloy is dropped into the above solution comprising the pH controlling agent and the reducing agent. There are ions of the raw material of the thermoelectric conversion material or metal ions, such as Co ions or Sb ions, in the solution containing a salt of an element constituting the thermoelectric conversion material. Therefore, as shown in FIG. 3a, these ions are reduced when mixed with a solution containing a reducing agent, depositing particles 4 or 4' of the element constituting the thermoelectric conversion material, such as Co particles or Sb particles, and metal or alloy particles 2. In the reduction, by-product such as NaCl and $NaBO_3$ are produced in addition to Co or Sb particles. In order to remove the by-products, filtration is preferably performed. Further, after the filtration, it is preferable that the by-products are rinsed away by adding alcohol or water after filtration.

The particles of the element constituting the thermoelectric conversion material and particles of metal or alloy thus obtained are heat-treated, for example, with an autoclave. By this heat treatment, the thermoelectric conversion material is hydrothermally synthesized from the particles of the element constituting the thermoelectric conversion material, and there is a larger amount of metal or alloy than the amount of metal or alloy which is solid-dissolved in the thermoelectric conversion material and forms an alloy. The metals or alloys 2 are deposited as a dispersion phase in the continuous phase of the thermoelectric conversion material 1 (FIG. 3b). The time or temperature of the heat treatment varies depending on the kind and content of the solvent or the thermoelectric conversion material to be used, thus, it is preferable that the time or the temperature is controlled appropriately.

The composite comprising the continuous phase an the dispersion phase, as mentioned above are filled and sintered in the subsequent sintering step (FIG. 3c). In addition to the sintering step, a forming step forming the thermoelectric conversion material by pressurizing can be included. In the present invention, the sintering step and the forming step may be separately provided to individually perform the pressure forming and sintering, however, it is preferable that the sintering be performed while performing the pressurization forming. As methods for performing the sintering while performing the pressurization forming, any hot press sintering, hot isostatic press sintering, spark plasma sintering, etc., may be used. Among them, spark plasma sintering can be advantageously used in view of the fact that it takes a short of time to increase the temperature and perform the sintering, and the grain-growth can be easily controlled. The sintering temperature in the spark plasma sintering method is preferably 400 to 800° C., and more preferably 450 to 650° C. for $CoSb_3$ group. The sintering time is preferably 90 minutes or less, and more preferably 60 minutes or less. The pressure of the pressurization is preferably 20 MPa or more, and more preferably 40 MPa or more.

Another method for manufacturing the thermoelectric converter of the present invention comprises the steps of: dropping a solution comprising a salt of an element constituting a thermoelectric conversion material into a solution comprising metal or alloy particles having a higher melting point than that of the thermoelectric conversion material and an average particle size of 1 to 100 nm, a pH controlling agent and a reducing agent; reduction-depositing particles of the raw material of the thermoelectric conversion material on the metal or alloy particles; heating the particles of the raw material to form composite particles in which the thermoelectric conversion material is coated on the metal or alloy particle; and filling and sintering the composite particles.

Regarding the salt of the element constituting the thermoelectric conversion material, the solvent forming the solution, the pH controlling agent, and the reducing agent can be the same as those used in the production method mentioned above. Metal or alloy particles having an average particle size of 1 to 100 nm (FIG. 4a) can be prepared by various methods, and are preferably prepared by reducing the salt of the metal or alloy.

When the solution containing the salt of the element constituting the thermoelectric conversion material is dropped into a solution containing the metal or alloy particles having an average particle size of 1 to 100 nm, the pH controlling agent, and the reducing agent, there are ions of the element constituting the thermoelectric conversion material, for example, Co ions or Sb ions in the solution containing the salt of the element constituting the thermoelectric conversion material. Therefore, when mixed with the solution containing the reducing agent, these ions are reduced, and particles 4 of the element constituting the thermoelectric conversion material, such as Co particles or Sb particles, are deposited on the surface of the metal or alloy particles 2, as shown in FIG. 4b.

Next, the thermoelectric conversion material is hydrothermally synthesized from the particles of the elements constituting the thermoelectric conversion material by heat treatment. As the time or temperature of the heat treatment varies depending on the type and content of the solvent or the thermoelectric conversion material to be used, it is preferable that the time or the temperature be controlled appropriately. As a result of the hydrothermal synthesization by heat treatment, the composite particles, having a core portion made of a metal or alloy and a shell portion made of the thermoelectric conversion material, are produced.

The average thickness of the coating layer of the thermoelectric conversion material in the obtained composite particles is preferably not more than the mean free path of the phonons of the thermoelectric conversion material, more preferably not more than half the mean free path of the phonons, yet preferably more than half the mean free path of the carriers but less than the half the mean free path of the phonons, and specifically and preferably in the range of 0.5 to 50 nm, more preferably 5 to 50 nm.

Figure 4:
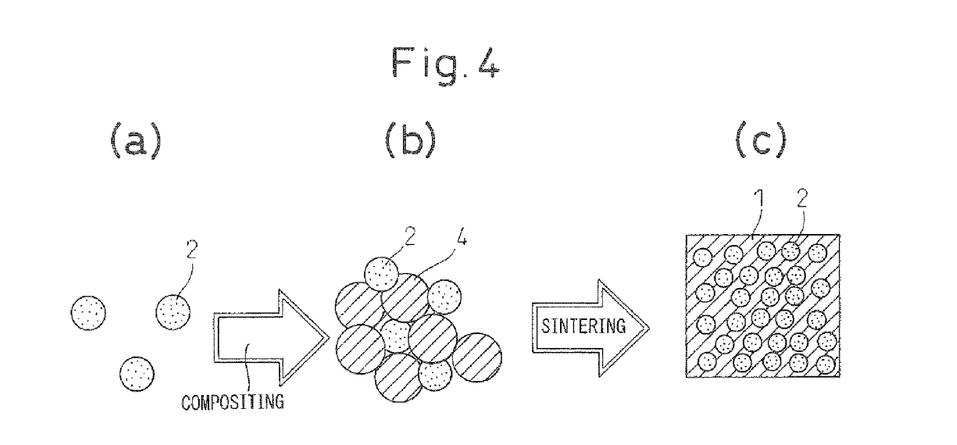
FIG. 4 is a FIG. representing the manufacture steps of the thermoelectric converter of the present invention.

The composite particles are filled and sintered in the subsequent sintering step (FIG. 4c). The sum of the thicknesses of the coating layers of the adjacent filled composite particles is approximately identical to the dispersion distance of the metal or alloy particles. Thus, when the average thickness of the coating layers of the composite particles is half the mean free path of the phonons, the dispersion distance of the metal or alloy particles 2 in the thermoelectric conversion material 1 is substantially identical to the mean free path of the phonons.

The thickness of the coating layers can be controlled by controlling the ratio of the number of particles of an insulating material to be added to a slurry and the amount of the thermoelectric conversion material in the slurry. As mentioned above, in the present invention, as the thickness of the coating layers made of the thermoelectric conversion material in the composite particles can be controlled, the dispersion distance of the metal or alloy particles in the thermoelectric conversion material which is finally obtained can be controlled.

In the subsequent sintering step, the composite particles thus obtained are filled and sintered, Consequently, the shell portions of the adjacent composite nano particles (the coating layers formed of the thermoelectric conversion material) are bound and form a network. The particle size of the core portions of the filled composite particles (metal or alloy particles) is almost the same as the particle size of the insulating material after sintering. Furthermore, the distance defined by the sum of the thicknesses of the shell portions of the adjacent filled composite particles, which varies depending on the filling density of the composite particles, etc., is determined by the dispersion distance of the metal or alloy particles after, sintering.

In the manufacturing method of the present invention, the thermoelectric conversion material as the shell portion is present between the metal or alloy particles, so that the metal or alloy particles tend not to bind, and thus the uneven distribution of the metal or alloy particles hardly occurs, compared with the conventional method. Also, as the dispersion distance of the metal or alloy particles can be controlled by the thicknesses of the shell portions, a thermoelectric conversion material in which the phonons can be sufficiently scattered can be designed to increase performance index ZT.

As can be understood from the foregoing, the method for manufacturing the thermoelectric converter according to the present invention can control the structure size (particle size of the insulating material or disperse distance of metal or alloy particles) of the thermoelectric conversion material in the nano order.

Note that, the thermoelectric converter of the present invention may be produced by a method other than the above methods, for example, by producing metal or alloy particles and thermoelectric conversion material particles, and mixing and sintering them. In any case, the structure size (particle size of metal or alloy particle or dispersion distance of metal or alloy particles) of the thermoelectric conversion material becomes smaller than the mean free path of phonons and preferably larger than the mean free path of carriers, so that the phonons in the thermoelectric converter are sufficiently scattered and thermal conductivity κ can be decreased. Consequently, a thermoelectric converter having a high performance index ZT represented by Formula (1) is obtained.

As can be seen above, a thermoelectric converter having a high performance index ZT more than 2, which was difficult to realize in the prior art, can be obtained by the method for manufacturing the thermoelectric converter according to the present invention.

EXAMPLE

Example 1

2.0 g of sodium borohydride as a reducing agent was mixed in 100 mL of ethanol. On the other hand, 0.9 g of cobalt chloride, 3.6 g of antimony chloride, and 0.18 g of nickel chloride were mixed in 100 mL of ethanol, and the solution was dropped into the above sodium borohydride solution. Cobalt, antimony, and nickel particles formed thereby, were rinsed with a mixed solution of ethanol and water (mixing ratio 1:1), and impurities were removed.

Figure 5:
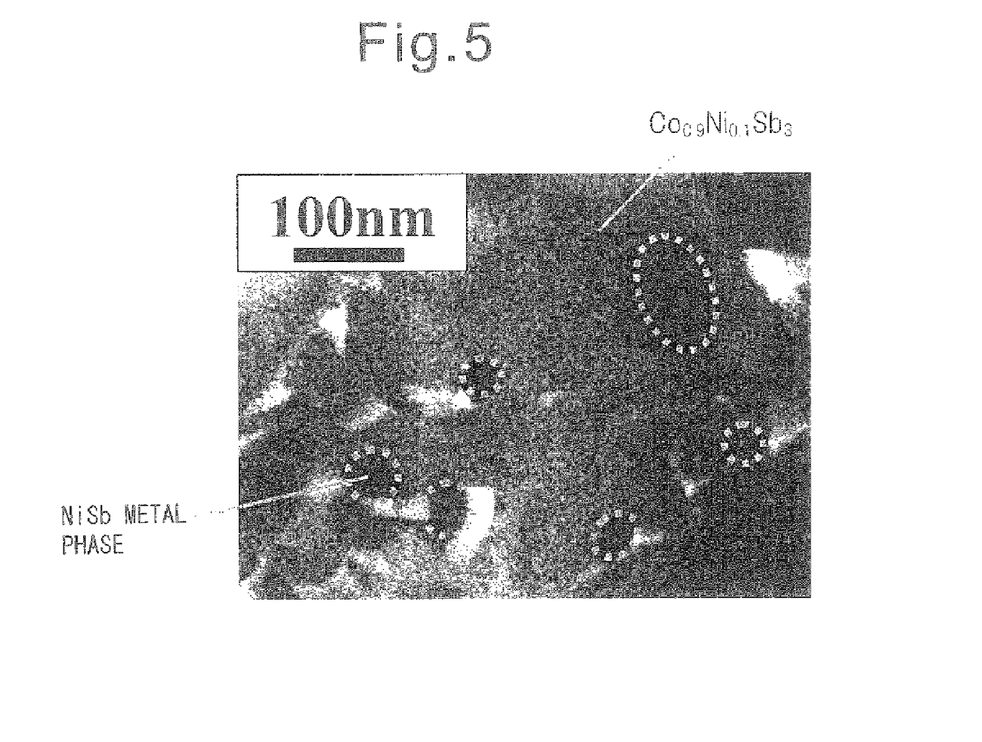
FIG. 5 is a TEM image of the sintered body of Example 1.

The resulting slurry comprising the cobalt, antimony, and nickel was hydrothermally treated at 240° C. for 24 hours. Consequently, NiSb was deposited in the thermoelectric conversion material due to an excess amount of nickel and antimony which exceed the solid dissolution limit of the aimed thermoelectric conversion material $Co_{0.9}Ni_{0.1}Sb_3$. After that, the thermoelectric converter of the present invention was obtained by SPS sintering at 500° C. The TEM image of the thermoelectric converter is shown in FIG. 5. The NiSb phase having a size of 20 to 50 nm was evenly distributed in the $Co_{0.9}Ni_{0.1}Sb_3$ continuous phase. The results of property evaluation of the thermoelectric converter are shown in the table below.

TABLE 2

|  | Seebeck coefficient (μV/K) | Electrical resistivity (μΩm) | Thermal conductivity (W/m/K) | Thermoelectric property ZT |
|---|---|---|---|---|
| $Co_{0.9}Ni_{0.1}Sb_3$ | −170 | 13 | 4.6 | 0.35 |
| Product of the present invention | −151 | 10.1 | 2.1 | 0.8 |

The average particle size and the average distance of the particles in the continuous phase were obtained by calculating the averages of 20 samples through TEM and high resolution SEM observation. The sampling results are shown in Table 3 below.

TABLE 3

| Particle size | Distance between 2 particles |
|---|---|
| 12 | 20 |
| 12 | 28 |
| 8 | 8 |
| 20 | 28 |
| 10 | 16 |
| 16 | 36 |
| 16 | 24 |
| 12 | 52 |
| 28 | 40 |
| 40 | 32 |
| 20 | 16 |
| 9 | 36 |
| 34 | 32 |
| 24 | 56 |
| 18 | 32 |
| 38 | 16 |
| 17 | 8 |
| 64 | 8 |
| 168 | 4 |
| 292 | 16 |
| Sum 857 | Sum 508 |
| Average 43 | Average 25 |

Example 2

0.7 g of sodium borohydride as a reducing agent was mixed with 100 mL of ethanol. On the other hand, 0.8 g of nickel chloride, and 0.77 g of antimony chloride were mixed with 100 mL of ethanol, and the solution was dropped into the above sodium borohydride solution. Thus, particles of nickel antimony were produced, hydrothermally treated at 240° C. for 24 hours, and NiSb alloy particles having an average particle size of 10 to 20 nm were obtained. 0.6 g of the NiSb alloy particles were added to 100 mL of ethanol, and 1.7 g of sodium borohydride was further added.

Figure 6:
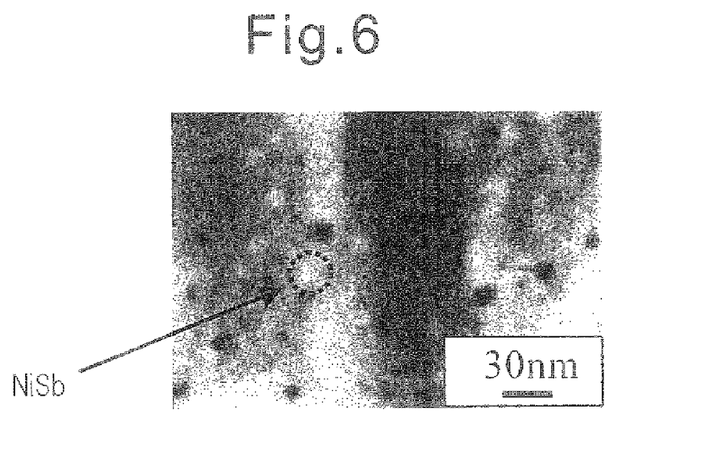
FIG. 6 is a TEM image of the sintered body of Example 2.

0.9 g of cobalt chloride, 2.7 g of antimony chloride, and 0.057 g of nickel chloride were mixed with 100 mL of ethanol, and the solution was dropped into the above ethanol solution comprising NiSb alloy. Thus, particles of Co, Ni, and Sb were deposited around the NiSb alloy particles. Then, hydrothermal treatment at 240° C. for 24 hours was performed to obtain composite particles coated with the thermoelectric conversion material comprising Co, Ni, and Sb on the NiSb alloy particles. After that, the thermoelectric converter of the present invention was obtained by SOS sintering at 500° C. The TEN image of the thermoelectric converter is shown in FIG. 6. The NiSb phase having a size of 10 to 50 nm was evenly distributed in the $Co_{0.94}Ni_{0.06}Sb_3$ continuous phase. The results of property evaluation of the thermoelectric converter, are shown in following table.

TABLE 4

| | Seebeck coefficient (μV/K) | Electrical resistivity (μΩm) | Thermal conductivity (W/m/K) | Thermoelectric property ZT |
|---|---|---|---|---|
| $Co_{0.94}Ni_{0.06}Sb_3$ | −200 | 15 | 3.5 | 0.5 |
| Product of the present invention | −180 | 8.4 | 2.5 | 1.03 |

The measurement results of the average particle size and the average of distance of the NiSb particles in the continuous phase are shown in Table 5 below.

TABLE 5

| Particle size | Distance between 2 particles |
|---|---|
| 12 | 20 |
| 12 | 12 |
| 8 | 8 |
| 20 | 28 |
| 10 | 16 |
| 16 | 36 |
| 16 | 24 |
| 12 | 8 |
| 28 | 40 |
| 20 | 32 |
| 12 | 16 |
| 9 | 12 |

TABLE 5-continued

| Particle size | Distance between 2 particles |
|---|---|
| 17 | 32 |
| 8 | 44 |
| 18 | 12 |
| 32 | 16 |
| 14 | 8 |
| 64 | 8 |
| 168 | 4 |
| 292 | 16 |
| Sum 788 | Sum 392 |
| Average 39 | Average 20 |

As mentioned above, according to the thermoelectric converter of the present invention, the thermoelectric properties have been greatly improved by compounding the metals in the thermoelectric conversion material.

The invention claimed is:

1. A method of manufacturing a thermoelectric conversion material, comprising:
dropping a solution, which contains a salt of an element constituting the thermoelectric conversion material and a larger amount of a salt of a metal or alloy than the amount of the salt which is solid-dissolved in the thermoelectric conversion material and forms an alloy, into a solution containing a pH controlling agent and a reducing agent;
forming particles of the element constituting the thermoelectric conversion material and the metal or alloy;
forming a dispersion phase of the metal or alloy in a continuous phase of the thermoelectric conversion material by heat treatment; and
sintering the same.

2. A method of manufacturing a thermoelectric conversion material comprising:
dropping a solution containing a salt of an element constituting the thermoelectric conversion material, into a solution containing metal or alloy particles having a higher melting point than that of the thermoelectric conversion material and an average particle size of 1 to 100 nm, a pH controlling agent, and a reducing agent;
reduction-depositing particles of the raw material of the thermoelectric conversion material on the metal or alloy particles;
heating the particles of the raw material to form composite particles in which the thermoelectric conversion material is coated on the metal or alloy particle; and
filling and sintering the composite particles.

* * * * *